United States Patent
Delaet et al.

(10) Patent No.: US 9,395,424 B2
(45) Date of Patent: Jul. 19, 2016

(54) MAGNETIC FIELD SENSOR

(71) Applicant: Commissariat a l'energie atomique et aux energies alternatives, Paris (FR)

(72) Inventors: Bertrand Delaet, Bernin (FR); Bernard Viala, Sassenage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 912 days.

(21) Appl. No.: 13/681,910

(22) Filed: Nov. 20, 2012

(65) Prior Publication Data
US 2013/0141091 A1 Jun. 6, 2013

(30) Foreign Application Priority Data
Nov. 25, 2011 (FR) ...................... 11 60781

(51) Int. Cl.
*G01R 33/09* (2006.01)
*H01F 10/32* (2006.01)
*H01L 43/02* (2006.01)
*G11B 5/39* (2006.01)

(52) U.S. Cl.
CPC ............ *G01R 33/093* (2013.01); *G01R 33/095* (2013.01); *H01F 10/32* (2013.01); *H01L 43/02* (2013.01); *G11B 5/3909* (2013.01)

(58) Field of Classification Search
CPC .... B82Y 25/00; G01R 33/093; G01R 15/205; Y10T 428/1114; H01L 43/08; G01L 1/125
See application file for complete search history.

(56) References Cited

U.S. PATENT DOCUMENTS

| 6,117,569 | A | 9/2000 | Lin et al. |
| 6,127,053 | A | 10/2000 | Lin et al. |
| 2004/0137275 | A1 | 7/2004 | Jander et al. |
| 2006/0268465 | A1* | 11/2006 | Ide ........................ B82Y 40/00 360/313 |
| 2007/0144616 | A1* | 6/2007 | Thai ....................... B82Y 25/00 148/121 |

(Continued)

FOREIGN PATENT DOCUMENTS

| DE | 100 54 016 A1 | 5/2002 |
| FR | 2 905 793 | 3/2008 |
| WO | 2005/064783 | 7/2005 |
| WO | 2011/001293 | 1/2011 |

OTHER PUBLICATIONS

Noel, J.-P. et al. "Multi-$V_T$ Device Optimizations Based on Circuit Environment Constraints in UT2B-FDSOI Technology" *IBM/STMicroelectronics* (2010).

(Continued)

*Primary Examiner* — Huy Q Phan
*Assistant Examiner* — Dustin Dickinson
(74) *Attorney, Agent, or Firm* — Occhiuti & Rohlicek LLP

(57) ABSTRACT

A magnetic field sensor has a magnetoresistive rod having a stack of stacked layers that include a pinned layer having a fixed magnetization direction almost perpendicular to a longitudinal direction, a free layer comprising a magnetostrictive material having a coefficient of magnetostriction greater than 20 ppm to 25° C. and a longitudinal axis of easiest magnetization, the magnetization changing when the free layer is exposed to a magnetic field, a non-magnetic spacer layer interposed between the free and pinned layers to form a tunnel junction or spin valve, and a stress-generating layer for exerting uniaxial stress essentially such that a product of stress and magnetostriction coefficient is greater than 500 ppm·MPa at 25° C. The rod's length is at least ten times its greatest width.

14 Claims, 2 Drawing Sheets

(56) References Cited

U.S. PATENT DOCUMENTS

2008/0272771 A1 11/2008 Guo et al.
2010/0084724 A1* 4/2010 Dimitrov ............... G11C 11/16
257/421

OTHER PUBLICATIONS

P.E. Bill Drafts "Magnetoresistive Current Sensor Improves Motor Drive Performance" *Pacific Scientific OECO* (1998).

* cited by examiner

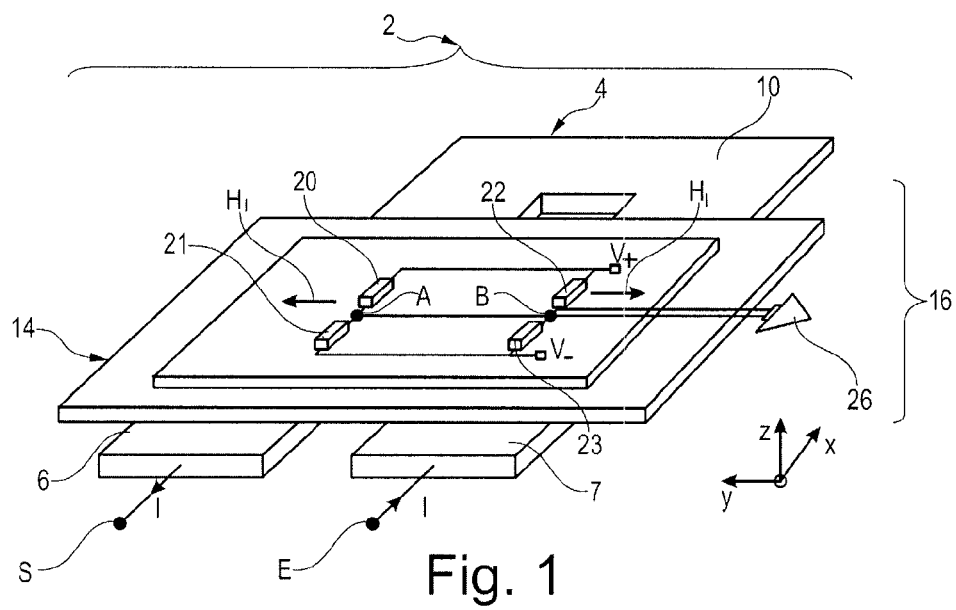
Fig. 1
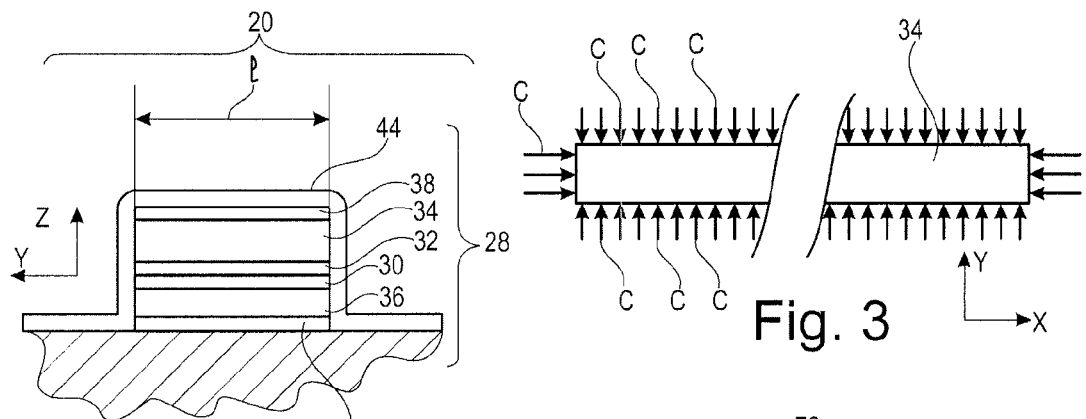
Fig. 2
Fig. 3
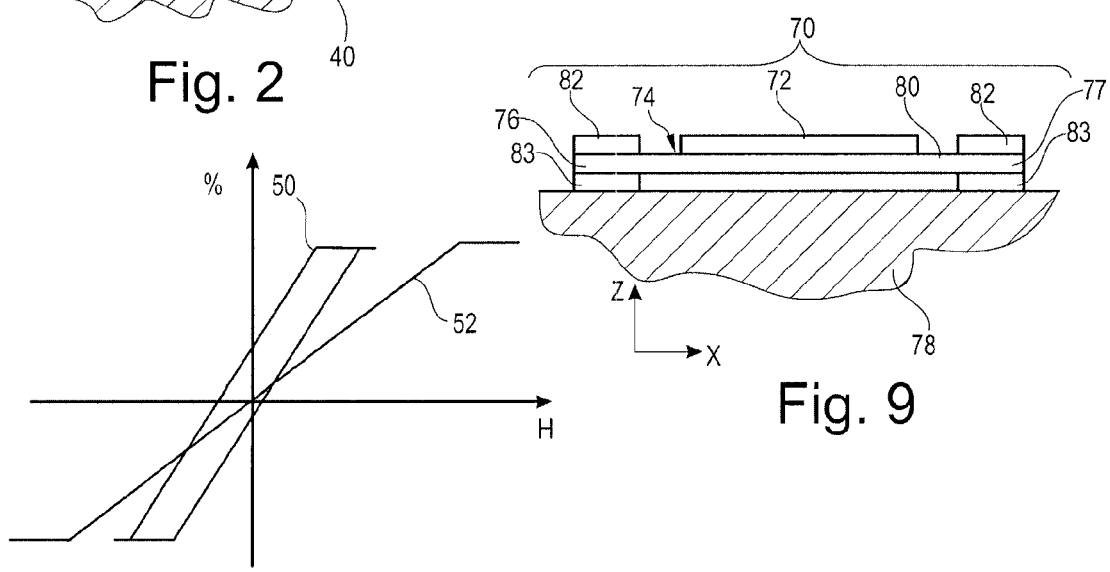
Fig. 4
Fig. 9

MAGNETIC FIELD SENSOR

RELATED APPLICATIONS

Under 35 USC 119, this application claims the benefit of the priority date of French Patent Application 1160781, filed Nov. 25, 2011, the contents of which are herein incorporated by reference.

FIELD OF DISCLOSURE

The invention pertains to a magnetic field sensor as well as to a current sensor incorporating this magnetic field sensor. The invention also pertains to a magnetoresistive rod used in these sensors.

BACKGROUND

Typically, the current sensors concerned operate for currents of 10 μA to 5000 A, especially for high currents of over 100 A.

The term "non-magnetic material" here below designates a material that does not show magnetization that is measurable in a zero field. Such a non-magnetic material is therefore devoid of iron, cobalt and nickel.

A prior-art current sensor comprises:
an electrical conductor extending along a direction X, and
a known magnetic field sensor fixed without any degree of freedom to this electrical conductor.

The known magnetic field sensor comprises at least one magnetoresistive rod comprising a stack of at least:
a first magnetic layer, called a "pinned layer" the magnetization direction of which is fixed and perpendicular to the longitudinal direction to within plus or minus 10°,
a second magnetic layer, called a "free layer", the axis of easiest magnetization of which is parallel to the longitudinal direction and the magnetization of which can turn when it is subjected to a magnetic field to be measured, and
a non-magnetic layer, called a "spacer" interposed between the two above layers to form a tunnel junction or a spin valve.
the length of the rod, in its longitudinal direction, being at least ten times greater than its greatest width in a transverse direction perpendicular to the longitudinal direction and parallel to the layers of the stack.

In the known sensors, the length of the bar in the longitudinal direction is at least ten times greater than its greater length in the crosswise direction perpendicular to the longitudinal direction and parallel to the layers of the stack.

Such a known current sensor is described for example in the patent application US2004/0137275. Another known sensor is described in the following document A0:
Bill Drafts, "*Magnetoresistive Current Sensor Improves Motor Drive Performance*", Pacific Scientific—OECO, 4607 SE International Way, Milwaukie, Oreg. 97222.

In these sensors, the shape ratio or aspect ratio of the magnetic rods is great, i.e. greater than 20, 40 or 100. The term "shape ratio" or "aspect ratio" designates the ratio of the length of the magnetoresistive rod to its width.

This high shape ratio is necessary to be able to adjust the sensitivity of the magnetoresistive rod over a very wide range and therefore to enable this magnetoresistive rod to measure magnetic fields of high intensity. Indeed, the greater the shape ratio, the more difficult it is to cause the direction of magnetization of the free layer to turn. Magnetoresistive rods with a shape ratio of over 1000 have therefore been proposed. However, these magnetoresistive rods are then very long, making the sensor bulky.

Furthermore, magnetoresistive rods show hysteresis. Indeed, the variation of their resistance as a function of a magnetic field to be measured is not the same depending on whether the magnetic field to be measured increases or diminishes. The solution presently applied to resolve this problem uses auxiliary sources that generate a magnetic field in parallel to the direction of easiest magnetization of the free layer. Typically, these magnetic field auxiliary sources are permanent magnets or electrical conductors. The presence of these auxiliary sources increases the complexity of the sensor and its space requirement.

Prior art is known from: U.S. Pat. No. 6,117,569A, US2008/272771 A1 and DE 100 54 016 A1.

SUMMARY

The invention seeks to overcome at least one of these drawbacks.

The fact of exerting a mechanical stress on the free layer in the longitudinal direction produces the same effects as the auxiliary magnetic field sources. In the above sensor, the auxiliary sources can therefore be simplified or omitted, thus simplifying the manufacture of the sensor.

Furthermore, for equal performance with the prior-art sensors devoid of the generating layer, the magnetoresistive rod of the above sensor:
has a smaller shape ratio, which decreases its space requirement, and/or
a greater width, thus improving the signal-to-noise ratio.

The embodiments of this magnetic field sensor can have one or more of the following features.

These embodiments of the magnetic field sensor furthermore have the following advantages:
the use of a Wheatstone bridge increases the sensitivity of the measurement of the magnetic field, and
the fact that the resistance values of the second and fourth examples of the magnetoresistive rod vary in the same sense compensates for the measurement distortions related to the presence of an external magnetic field that is homogeneous throughout the surface of the sensor or caused by temperature variations.

An object of the invention is also a current sensor in which the above magnetic field sensor is fixed to the electrical conductor so that the direction of magnetization of the pinned layer of the magnetoresistive rod is perpendicular to the direction X, to within plus or minus 10°.

This embodiment of the current sensor furthermore has the following advantage:
placing at least one of the magnetoresistive rods of the first arm in proximity to the first strand and at least one of the magnetoresistive rods of the second arm in proximity to the second strand increases the sensitivity of the current sensor and limits noise.

An object of the invention is also a magnetoresistive rod for the above magnetic field or current sensor.

Additional embodiments of the magnetoresistive rod furthermore have the following advantages:
the use of a prestressed layer makes it possible to exert mechanical stress permanently on the free layer without consuming electrical energy,
surrounding the free layer with the prestressed layer makes it possible to exert a uniaxial stress in the longitudinal direction of the magnetoresistive rod because of the shape factor of this rod, and to do so even if the pre-stressed layer is distant from the free layer, using a generating layer in the form of a suspended beam and a controllable actuator capable of stretching or compressing this beam makes it possible to vary the stress applied to the free layer.

BRIEF DESCRIPTION OF THE FIGURES

The invention will be understood more clearly from the following description given solely by way of a non-exhaustive example and made with reference to the drawings, of which:

FIG. 1 is a schematic illustration in perspective of sensor of high-intensity current, FIG. 2 is a schematic illustration in vertical section of the cross-section of a magnetoresistive rod used in the sensor of FIG. 1, FIG. 3 is a schematic illustration in a top view of a stress applied to a free layer of the magnetoresistive rod of FIG. 2, FIG. 4 is a graph illustrating the modification of the sensitivity of the magnetoresistive rod of FIG. 2 caused by the application of a stress to the free layer, FIG. 9 is a schematic illustration in vertical section of another embodiment of a stress-generating layer.

In these figures, the same references are used to designate the same elements.

DETAILED DESCRIPTION

Figure 5:
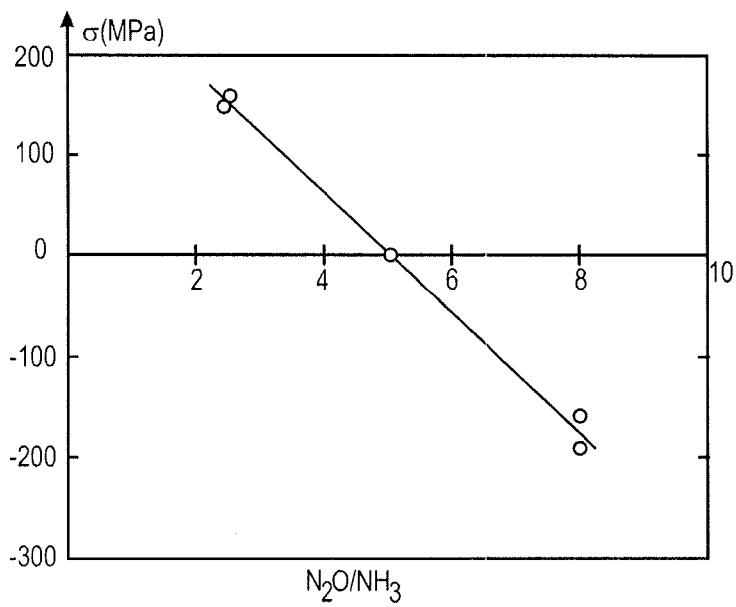
FIG. 5 is a graph illustrating the variation of the mechanical stress as a function of a ratio between the flow-rates of two different gases.
Figure 6:
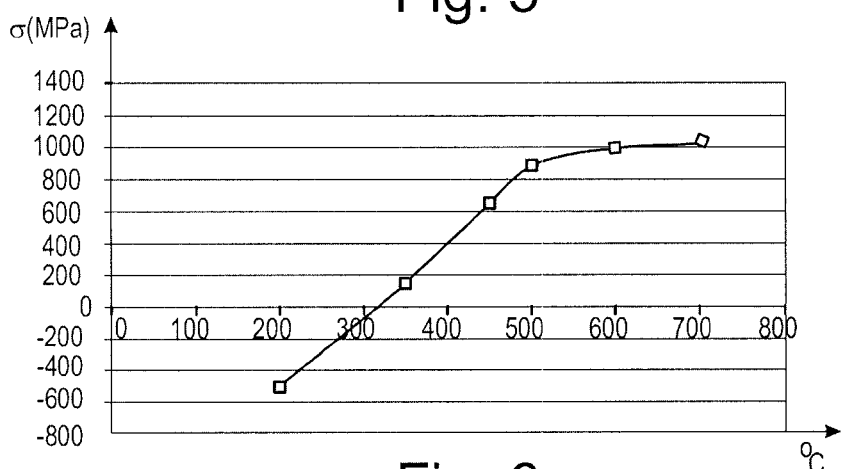
FIG. 6 is a graph illustrating the adjustment of a stress in a prestressed layer as a function of an annealing temperature.

Here below in this description, the characteristics and functions well known to those skilled in the art are not described in detail.

FIG. 1 shows a high-intensity current sensor 2. This sensor 2 comprises an electrical conductor 4. The conductor 4 herein has two strands 6, 7 which are rectilinear and parallel with a horizontal direction X of an orthogonal referential system X, Y, Z. In the referential system X, Y, Z, the direction Y is also horizontal and the direction Z is vertical.

These strands 6, 7 are electrically connected to each other by an additional strand 10 so that the current to be measured flows in one sense in the strand 6 and in the opposite sense in the strand 7. Here, these strands 6, 7 and 10 form a "U".

The strands 6, 7 are also connected, respectively, to input and output terminals E and S of the current to be measured.

An electrically insulating support 14 rests without any degree of freedom on the strands 6 and 7 of the conductor 4. Here below, a material shall be considered to be insulating if its resistivity is greater than 1 Ω·m and preferably greater than $10^4$ Ω·m at 25° C.

The sensor 2 also has a magnetic field sensor 16 fixed without any degree of freedom to the support 14. This sensor 16 has four magnetoresistive rods 20 to 23 electrically connected to one another to form a Wheatstone bridge. A magnetoresistive rod is a component, the resistivity of which varies as a function of the magnetic field in which it is placed. The magnetic rods in question here are either spin valves or magnetic tunnel junctions and not anisotropic magnetoresistance devices.

This Wheatstone bridge comprises a first electrical arm and a second electrical arm electrically connected in parallel between reference potentials V+ and V−. The potential V− is for example the mass or the ground. The first arm successively comprises, going from the potential V+ to the potential V−, the magnetoresistive rods 20 and 21 series-connected by means of a midpoint A. The second arm successively comprises, going from the potential V+ to the potential V−, the arms 22 and 23 series-connected by means of a midpoint B.

The potentials $V_A$ and $V_B$ at the midpoints A and B are given by the following relationships:

$$V_A = (V_+ - V_{31})R_2/(R_1+R_2)$$

$$V_B = (V_+ - V_-)R_4/(R_3+R_4)$$

where $R_1$, $R_2$, $R_3$ and $R_4$ designate the values of resistance respectively of the rods 20 to 23.

Here, each rod 20 to 23 essentially has a rectangular parallelepiped shape, at least two big faces of which extend horizontally. The direction in which the rod chiefly extends is called a longitudinal direction. Here, this direction is horizontal and parallel to the direction X. The transverse direction is the horizontal direction orthogonal to the longitudinal direction. It is parallel to the direction Y.

Each rod has a high shape ratio, i.e. a shape ratio greater than 10 and preferably greater than 40 or 100. This shape ratio is defined by the shape ratio between the length L of the rod and its transverse width W.

For example, the length L is greater than 50 or 100 μm and preferably smaller than 1 mm. The transverse width W is typically greater than 0.3 μm or 1 μm and preferably lower than 15 μm or 30 μm.

Here, the rods 20 and 21 are positioned above the strand 6 so as to be at least two or three times closer to this strand 6 than the strand 7. Thus, the rods 20 and 21 are essentially sensitive to the magnetic field $H_I$ created by the current which flows in the strand 6. The direction of this magnetic field $H_I$ is shown in FIG. 1 by an arrow $H_I$ which extends in the direction Y.

Similarly, the rods 22 and 23 are positioned above the strand 7 so as to be two or three times closer to this strand 7 than the strand 6. Thus, the rods 22 and 23 are essentially sensitive to the magnetic field $H_I$ created by the current which flows in the strand 7. The direction of this magnetic field $H_I$ is represented in FIG. 1 by an arrow $H_I$ which extends in the direction opposite the direction Y.

The rods 21 and 22 are laid out so that their respective resistance values vary in the same sense in response to the same variation of the current 1 to be measured. Here, the rods 21 and 22 are identical.

In this embodiment, the rods 20 and 23 are also identical to the rods 21 and 22. However, the sensor 16 is laid out so that their resistance does not vary in response to the variation of the intensity of the current I in the conductor 4. For example, the sensor 16 has a magnetic screen interposed between the rods 20 and 23 and the conductor 4.

Finally, the sensor 2 has an electronic processing unit 26. This unit is capable of processing the difference in potentials between the points A and B to establish the intensity of the current I flowing in the conductor 4.

The structures of the different magnetoresistive rods are identical and only the structure of the rod 20 is described in greater detail with reference to FIG. 2.

The rod 20 has a stack 28 comprising, immediately consecutive to one another, a pinned layer 30, a spacer 32 and a free layer 34 in the vertical direction. A stack of this kind for obtaining giant magnetoresistance (GMR) is a conventional one. GMRs are also known as spin valves. This stack shall therefore not be described in greater detail.

The pinned layer 30 has magnetization of a fixed direction and is perpendicular to the direction X. The term "fixed direction" herein designates the fact that the direction of magnetization of this layer is far more difficult to modify than the direction of magnetization of the free layer.

For example, the layer 30 is a ferromagnetic layer. It can be made out of cobalt, nickel or iron or their alloys such as CoFe, NiFe, CoFeB or the like. The direction of magnetization of the pinned layer 30 is fixed by means of an anti-ferromagnetic layer 36. The layer 36 serves to trap the direction of magnetization of the layer 30. For example, the layer 36 is made out of a manganese alloy such as one of the following alloys IrMn, PtMn, FeMn, NiMn or the like.

The spacer 32 is a layer made out of non-magnetic material. This spacer 32 is thick enough to magnetically decouple the layers 30 and 34. Here, the spacer 32 is a layer made of conductive material such as copper.

The free layer 34 has a direction of magnetization that can be changed more easily than the direction of magnetization of the pinned layer. The direction of easiest magnetization of this layer 34 is here parallel to the longitudinal direction of the rod, i.e. in this case the direction X. For example, the layer 34 is a layer made out of ferromagnetic material or a stack of ferromagnetic layers.

The free layer 34 is made out of a magnetostrictive material. Here, it is the inverse magnetostrictive properties, also known as the "Villari effect" that are used. Inverse magnetostrictive properties are obtained by modifying the magnetic properties of a material in response to a variation of the mechanical stress exerted on this material. Typically, the application of a uniaxial stress a on a magnetostrictive material produces a uniaxial anisotropic magnetic field called $H_k$ or $H_\sigma$. The intensity of this field $H_\sigma$ is given by the following relationship: $H_\sigma = 3\lambda_s \sigma / M_S$, where:

$\lambda_s$ is the coefficient of magnetorestriction of the material expressed in ppm (parts per million or $10^{-6}$), and $M_S$ is the magnetic moment of the material at saturation.

The coefficient $\lambda_s$ of magnetorestriction is a standard parameter in magnetism that expresses the relative elongation (ppm in %) when the material is saturated by application of a magnetic field. The measurement techniques are standardized. For example, it may be a direct method such as the deflection of a bimetallic strip with application of a magnetic field and optical detection of bending (see instrument supplier Lafouda® (US) for measurement systems) or an indirect method such as the measurement of the hysteresis cycle in applying a stress (see instrument supplier SHB (US) of the BH looper®).

Preferably, the free layer has a coefficient $\lambda_s$, the absolute value of which is greater than 10, 20 or 40 ppm or even 50 or 100 ppm. Here, it is assumed that the free layer has positive magnetostrictive properties and therefore a positive coefficient $\lambda_s$.

The stack 28 comprises, at each end, a conductive electrode respectively 38 and 40 to obtain the flow of the current that crosses the magnetoresistive rod perpendicularly to the plane of the layers 30, 32 and 34.

The rod 20 also has a layer 44 generating a uniaxial tensile stress in the free layer 34 parallel to the direction X. In other words, this layer 44 tends to stretch the free layer 34 in the direction X.

It can be noted that a uniaxial tensile stress in the direction X is equivalent to exerting a compressive stress in the direction Y on the free layer 34.

In this embodiment, the layer 44 is a prestressed layer that exerts a uniform compressive stress on all the vertical faces of the free layer 34. To this end, the layer 44 covers the totality of the vertical faces of the free layer 34. In this embodiment, the layer 44 is directly deposited on the stack 28 and covers the majority of the vertical faces of this stack as well as the totality of its upper face. Thus, the layer 44 surrounds the free layer 34 uniformly. The thickness of the layer 34 is greater than the thickness of the free layer and typically greater than the thickness of the stack 28. To simplify FIG. 2, the ratio of thicknesses are not maintained in this figure.

Typically, the prestressed layer 44 exerts a uniform compressive stress a on the free layer of at least 10 MPa and preferably at least 30 to 40 MPa. Such a stress kind σ is called "positive" because it corresponds to a tensile stress in the direction X. Conversely, a stress a that compresses the free layer 34 in the direction X is said to be negative and to have a negative value.

The stress exerted by the layer 44 is adjusted by playing for example on the conditions of deposition of this layer 44. Here, the stress σ is adjusted so that the product $\lambda_s \sigma$ is positive and greater than 300 ppm·MPa and, preferably, greater than 500 ppm·MPa or 1000 ppm·MPa or 5000 ppm·MPa or 10 000 ppm·MPa. The fact that the product $\lambda_s \sigma$ is positive means that if the coefficient of magnetorestriction $\lambda_s$ is positive, it is necessary for the stress σ exerted to be also positive and to therefore correspond to a tensile stress. Conversely, if this coefficient $\lambda_s$ is negative, the stress σ must also be negative. It is then a compressive stress.

The conditions of deposition that must be brought into play depend on the material chosen to make the layer 44. Indeed, these conditions may be the depositing temperature, the proportion of precursors, the speed of deposition or the like. For example, the layer 44 is made out of an electrically insulating material such an oxide or a nitride. Thus, the layer 44 can be made out of $SiH_4$, $SiO_2$, TEOS ($Si(OC_2H_5)_4$), SiN, SiON, $Si_3N_4$, ..., etc. In the case of SiON, the stress σ is adjusted by playing on the ratio between the flow-rates of gases $N_2O$ and $NH_3$ as shown in the graph of FIG. 4. The x-axis of this graph shows a ratio of the flow-rates of gas $N_2O$ and of gas $NH_3$. The y-axis represents the stress σ expressed in MPa.

The layer 44 can also be made out of non-magnetic metal such as $W_2N$, Ru, Pt or the like. In this case, the stress σ can be adjusted as a function of an annealing temperature as illustrated in the graph of FIG. 5 in the particular case of platinum. In the graph of FIG. 5, the x-axis values represent the annealing temperature used while the y-axis values represent the value of the σ expressed in MPa. The patent application WO 2011/001293 also describes methods to adjust the stress σ in a prestressed layer.

When the layer 44 is made of metal, the value of the stress σ can be adjusted after the depositions of the stack 28 and the layer 44. Conversely, when the layer 44 is an insulator, the value of the stress σ is adjusted directly during the deposition of the layer 44 and does not change any more.

FIG. 3 makes it possible to understand how σ stress σ uniformly distributed on the free layer 34 makes it possible to exert a uniaxial stress in this layer. In FIG. 3, the layer 34 is shown in a top view. The arrows C uniformly distributed on the rim of the layer 34 represent the stress σ exerted on this rim.

Since the layer 34 is far longer than it is wide, the vertical faces parallel to the direction X are subjected to a far greater force than the end vertical faces parallel to the direction Y. Thus, the compressive stress exerted in the direction X is negligible as compared with the compressive stress exerted in the direction Y. This compressive stress in the direction Y is equivalent to a tensile stress in the direction X. Thus, a uniaxial tensile stress appears in the free layer 34 because the compressive stress in the direction X is negligible. On the contrary, the same arrangement, when applied to a free layer 34 without a high shape factor, does not enable the creation of a uniaxial stress. A high shape factor is superior to 20, 40 or 100.

FIG. 4 illustrates the variant of the resistivity of the magnetic rod 20 as a function of the intensity of the magnetic field in which it is placed. The y-axis is expressed in terms of percentage of the resistance of the rod 20 when there is no magnetic field. The x-axis is expressed in Tesla. The curve 50 represents the response of a magnetoresistive rod identical to the rod 20 but without the layer 44. The curve 52 represents the response of the rod 20 in the same conditions. The presence of the layer 44 makes it possible to linearize the response of the magnetoresistive rod and above all to reduce or eliminate the hysteresis in its response. Moreover, the layer 44 further reduces the sensitivity of the magnetoresistive rod, thus enabling the measurement of current having an even greater intensity or the obtaining, for equal performance, of a rod that is shorter or wider. Thus, the effects of the layer 44 are equivalent to those obtained with the use of an auxiliary magnetic field source but without resorting to an auxiliary source of this kind.

Figure 7:
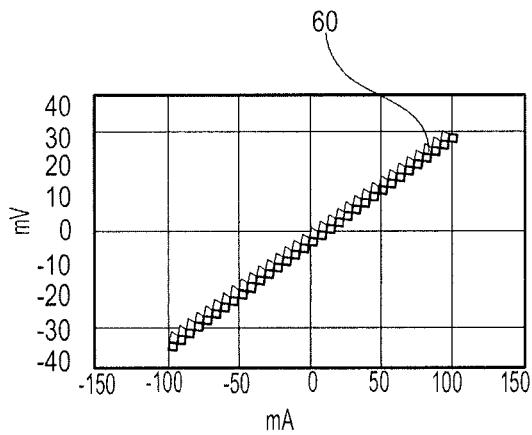
FIGS. 7 and 8 illustrate the response, respectively, of a current sensor devoid of a prestressed layer and of the sensor of FIG. 1.
Figure 8:
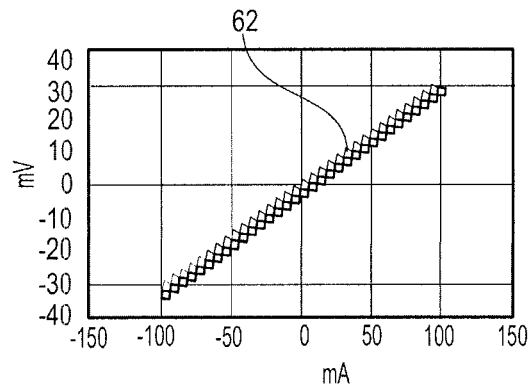

FIG. 7 represents the measurements delivered by a sensor identical to the sensor 2 but equipped with an auxiliary magnetic field source generating, in the longitudinal direction of each magnetoresistive rod, an 130-Oe magnetic field. The magnetoresistive rods used to plot the curve 60 of FIG. 7 are devoid of any stress generating layer. In FIGS. 7 and 8, the x-axis values represent the intensity of the current to be measured, while the y-axis values represent the difference in potentials between the points A and B expressed in millivolts.

FIG. 8 represents the measurements delivered by the sensor 2 when the layer 44 is laid out to exert a compressive stress $\sigma$ of 60 MPa. As shown by the curves 60 (FIGS. 7) and 62 (FIG. 8), the results obtained are almost identical. Thus, the layer 44 makes it possible to completely do without with the auxiliary magnetic field sources.

FIG. 9 shows a magnetoresistive rod 70 that can be used instead of each rod 20 to 23 in the sensor 2. This rod 70 has a magnetoresistive stack 72. This stack 72 is deposited on a uniaxial stress generating layer 74. More specifically, the layer 74 is a beam, the opposite ends 76, 77 of which are anchored without any degree of freedom to a rigid substrate 78. The part of the beam 74 situated between the anchored ends 76, 77 defines a central arm 80 suspended above the substrate 78. The beam 74 and the mechanical actuator to generate a uniaxial stress in this beam are for example identical to those described in the patent application FR2 905 793. In particular, at least one of the ends 76, 77 and preferably both ends as well as the central arm 80 are made out of piezoelectric material. The ends 76, 77 are then interposed between an upper electrode 82 and a lower electrode 83 to command and actuate this piezoelectric material.

The beam extends essentially in the longitudinal direction of the stack 72 to generate a uniaxial stress parallel to this direction. The thickness $\underline{e}$ of the central arm 80 in the vertical direction is strictly greater than the thickness of the free layer in the stack 72 and typically greater than the thickness of the stack 72. For example, the thickness $\underline{e}$ is greater than 1 µm or 3 µm. The thickness of the stack 72 is often smaller than 100 or 200 or 500 nm.

To efficiently create a stress $\sigma$ in the free layer of the stack 72, the horizontal faces of the free layer and the beam should not be separated by more than a distance d strictly smaller than the thickness $\underline{e}$ of the beam. Preferably, the distance d is smaller than 10 or 100 times the thickness $\underline{e}$. Here, the stack 72 is for example identical to the stack 28 except that this stack is made in the inverse order. Thus, the free layer 34 and the beam 74 are separated only by the electrode 38. The thickness of the electrode 38 is chosen to be smaller than 10 or 100 times the thickness $\underline{e}$. This embodiment works like the previous one except that the stress $\sigma$ exerted on the free layer by the layer 74 is adjustable by playing on the voltage between the electrodes 82 and 83.

Many other embodiments are possible. For example, the stack 28 can be replaced by a stack forming a magnetic tunnel junction using the tunnel effect better known as TMR (tunnel magnetoresistance). In a tunnel junction, the spacer is made out of an insulating non-magnetic material. For example, it may be an aluminium oxide or nitride. For example, the spacer is made out of aluminium oxide $Al_2O_3$, manganese oxide MgO or strontium titanate ($SrTiO_3$) or the like.

In another embodiment, the rod 20 is positioned so that its resistance varies inversely with the resistance of the rod 21 when they both undergo the same magnetic field variation. Preferably, the amplitudes of the variations of the restivity of the rods 20 and 21, in response to a same variation of the magnetic field, are equal to within plus or minus 10%. For example, the rods 20 and 21 are identical but mounted inversely so that the direction of magnetisation of the pinned layer of one of them has a sense that is the inverse of that of the other rod. It is also possible to turn back the direction of magnetisation of the pinned layer by local magnetothermal effect. The pinned layer of one of the two rods is then heated and a magnetic field is applied locally to reverse the direction of magnetisation of the pinned layer of this rod. The rods 22 and 23 are laid out similarly to what has just been described for the rods 20 and 21. In this embodiment, the magnetic screen between the rods 20 and 22 and the conductor 4 is omitted.

It is also possible to shape the conductor 4 as a meander so that the current to be measured flows in the same sense beneath the rods 20 and 22 and in the opposite sense beneath the rods 21 and 23. In this embodiment, the magnetic screen is omitted.

The free layer can be made out of a magnetic material having negative magnetostrictive properties, which corresponds to a coefficient $\lambda_s$ strictly below zero. For example, the free layer is made out of cobalt. In this case, the stress $\sigma$ generating layer is designed to generate a compressive uniaxial stress in the direction X and no longer, as here above, in the direction Y. In the case of a prestressed layer such as the layer 44, it is laid out to exert a negative stress $\sigma$ in the direction X. The layer 44 must cover at least one face of the stack 28 which extends in the longitudinal direction of the rod. Preferably, the layer 44 covers this face from one of its ends, up to the opposite end in the longitudinal direction, i.e. in this case along the direction X.

Thus, as a variant, the generating layer 44 covers a lateral face of the stack 28 parallel to the longitudinal direction. For example, the layer 44 covers solely the part of the lateral faces of the stack 28 facing or in direct contact with the vertical faces of the free layer 34. Thus, it is not necessary for the layer 44 to cover the upper face or lower face of this stack or for the layer 44 to cover the totality of the vertical faces of this stack.

Conversely, the layer 44 can cover only the upper and/or lower horizontal face of the free layer 34 without covering the vertical faces of this free layer. Thus, in FIG. 2, the layer 44 can be positioned solely above the layer 38 and/or below the layer 40. In this case, the maximum distance $\underline{d}$ between the layer 44 of the horizontal face closest to the free layer 34 is smaller than the distance d previously described in the case of the beam 74.

The layer 44 can be in direct contact with the stack 28 or separated from the stack 28 by one or more intermediate layers. In particular, should the layer 44 be a metal layer, preferably an electrically insulating layer is interposed between the layer 44 and the stack 28 so as to prevent shorting between the different layers of the stack.

Advantageously, it will be chosen to deposit the stack in such a way that the free layer is as close as possible to the layer 44.

Thus, in this description, when it is said that the layer 44 "covers" the stack 28, this designates any one of the embodiments described here above and especially designates the fact that:
- the prestressed layer can equally well be above or below the free layer in the stack, and
- that it can be in direct contact with this free layer or separated from this free layer by an intermediate layer, for example an electrical insulation layer or a growth layer.

Should the prestressed layer extend solely in parallel to one of the horizontal faces of the free layer, preferably a horizontal face of the free layer is in direct contact with a corresponding horizontal face of the prestressed layer. To this end, the electrode 38 or 40 is moved so as to be in direct mechanical contact with the free layer by only end of this layer, for example by means of one of its vertical faces.

Should the prestressed layer 34 surround the free layer, the generator layer does not need to be in direct contact with the free layer so as to exert a stress σ on this free layer. For example, non-prestressed intermediate layers separate the prestressed layer from the free layer. In this case, the distance between the prestressed and the free layer does not need to be smaller than the above defined distance d.

Preferably, the pinned layer is made out of a non-magnetostrictive material, i.e. a material whose absolute value of the coefficient $\lambda_s$ is at least 100 times smaller than the absolute value of the coefficient of magnetostriction of the free layer. For example, the pinned layer is made out of an alloy FeNi.

The pinned layer can also be made out of a magnetostrictive material. In this case, its magnetostriction coefficient has the same sign as the magnetostriction coefficient of the free layer.

The presence of the stress-generating layer can be combined with the presence of auxiliary magnetic field sources of the prior-art sensors in order for example to decrease the space requirement of the magnetoresistive rod or simplify the auxiliary sources or decrease the signal to noise ratio of the sensor.

The rod 20 can have other shapes than that of a rectangular parallelepiped. For example, it can be shaped as a meander or a horseshoe. The magnetoresistive rod can also be formed by several rectilinear and mutually parallel strands, the ends of which are curved to meet the end of an immediately adjacent strand. In this case, each strand has a shape factor greater than 20, 40 or 100.

The mechanical actuator which stretches or compresses the beam 74 can be made differently. For example, it may be a thermal actuator that creates a difference of expansion between the substrate and the beam. It can also be an electrostatic actuator.

The invention claimed is:

1. An apparatus comprising a magnetic field sensor, said magnetic field sensor comprising a magnetoresistive rod comprising a stack having stacked layers, said stacked layers comprising a pinned layer having a fixed magnetization direction that is within ten degrees of being perpendicular to a longitudinal direction, a free layer comprising a magnetostrictive material having a coefficient of magnetostriction, the absolute value of which is greater than 20 ppm to 25° C. and having an axis of easiest magnetization that is parallel to said longitudinal direction, said free layer having a magnetization that changes when said free layer is subjected to a magnetic field to be measured, a non-magnetic spacer layer interposed between said free layer and said pinned layer to form one of a tunnel junction and a spin valve, and a stress-generating layer capable of exerting a uniaxial mechanical stress in a direction that is within ten degrees of being parallel to said longitudinal direction such that a product of said mechanical stress and said coefficient of magnetostriction is positive and greater than 500 ppm·MPa at 25° C., said magnetoresistive rod having a length in a longitudinal direction thereof and a greatest width in a transverse direction perpendicular to said longitudinal direction and parallel to said stacked layers, said length being at least ten times greater than said greatest width.

2. The apparatus of claim 1, wherein said magnetic field sensor comprises a Wheatstone bridge comprising a first electrical arm and a second electrical arm, said first and second electrical arms being electrically connected in parallel between a first potential and a second potential, said first arm successively comprising, going from said first potential to said second potential, a first copy and a second copy of said magnetic rod series-connected by a first midpoint, said second arm successively comprising, going from said first potential to said second potential, a third copy and a fourth copy of said magnetic rod series-connected by a second midpoint.

3. The apparatus of claim 2, wherein said second and third copies of said magnetic rod have resistances, values of which vary in the same sense when said second and third copies are subjected to a common variation of an external magnetic field.

4. The apparatus of claim 3, wherein the first and fourth copies have resistances, and wherein values of resistance of said first, second, third and fourth copies of the magnetic rod vary in the same sense when said first, second, third, and fourth copies are subjected to a common variation of an external magnetic field.

5. The apparatus of claim 1, further comprising an electrical conductor extending along a first direction, wherein said magnetic field sensor is fixed without any degrees-of-freedom to said electrical conductor so that a direction of magnetization of said pinned layer is within ten degrees of being perpendicular to said first direction.

6. The apparatus of claim 5, wherein said electrical conductor comprises a first strand and a second strand parallel to said first direction, said first and second strands being electrically connected to each other so that a current to be measured flows in a first sense in said first strand and in a second sense in said second strand, said second sense being opposite said first sense, wherein said magnetic field sensor comprises a Wheatstone bridge comprising a first electrical arm and a second electrical arm, said first and second electrical arms being electrically connected in parallel between a first potential and a second potential, said first arm successively comprising, going from said first potential to said second potential, a first copy and a second copy of said magnetic rod series-connected by a first midpoint, said second arm successively comprising, going from said first potential to said second potential, a third copy and a fourth copy of said magnetic rod series-connected by a second midpoint, and wherein said second copy of said magnetic rod extends along the first strand and said third copy of the magnetic rod extends along said second strand so that said second copy of said magnetic rod is closer to said first strand than to said second strand and said third copy of said magnetic rod is closer to said second strand than to said first strand.

7. The apparatus of claim 6, wherein said first copy of said magnetic rod extends along said first strand and said fourth copy of said magnetic rod extends along said second strand so that said first copy of said magnetic rod is closer to said first strand than to said second strand and said fourth copy of said magnetic rod is closer to said second strand than to said first strand.

8. A manufacture comprising a magnetostrictive rod, said magnetoresistive rod comprising a stack having stacked layers, said stacked layers comprising a pinned layer having a magnetization direction fixed and perpendicular to within ten degrees of a longitudinal direction, a free layer comprising a magnetostrictive material having a coefficient of magnetostriction, an absolute value of which is greater than 20 ppm to 25° C. and having an axis of easiest magnetization that is parallel to said longitudinal direction, said free layer having a magnetization that changes when said free layer is subjected to a magnetic field to be measured, a non-magnetic spacer interposed between said free layer and said pinned layer to form one of a tunnel junction and a spin valve, and a stress-generating layer capable of exerting a uniaxial mechanical stress in a direction that is within ten degrees of being parallel to said longitudinal direction such that a product of said mechanical stress and said coefficient of magnetostriction is positive and greater than 500 ppm·MPa at 25° C., said magnetoresistive rod having a length in a longitudinal direction thereof and a greatest width in a transverse direction perpendicular to said longitudinal direction and parallel to said stacked layers, said length being at least ten times greater than said greatest width.

9. The manufacture of claim 8, wherein said stress-generating layer comprises a pre-stressed layer that is different from said free layer, said pinned layer and said spacer, said pre-stressed layer having a thickness greater than that of said free layer and permanently exerting said stress on said free layer.

10. The manufacture of claim 9, wherein said stacked layers define a parallelepiped, and wherein said pre-stressed layer covers at least a part of a largest face of said parallelepiped.

11. The manufacture of claim 8, further comprising a rigid substrate, wherein said stress-generating layer comprises a beam having a beam-thickness, said beam having two ends that are fixed without any degrees-of-freedom to said rigid substrate, a central arm that extends between said two ends and suspended above said substrate, and a controllable actuator capable of at least one of stretching said central arm and compressing said central arm, wherein said stack is deposited on said face of said central arm in such a way that uniaxial stress applied by said central arm is within ten degrees of being parallel to said longitudinal direction, and wherein said stack has a stack thickness that is smaller than said beam thickness.

12. The manufacture of claim 11, wherein said free layer is at a first distance from a face of said central arm on which said stack is deposited and at a second distance from said pinned layer, said second distance being less than said second distance.

13. The manufacture of claim 8, wherein said rod has a length that is at least forty times greater than a transverse width thereof.

14. The manufacture of claim 8, wherein said rod has a length that is at least one hundred times greater than a transverse width thereof.

* * * * *